United States Patent
Hecht et al.

(10) Patent No.: US 7,199,604 B2
(45) Date of Patent: Apr. 3, 2007

(54) DRIVER CIRCUIT WITH LOW POWER TERMINATION MODE

(75) Inventors: Bruce A. Hecht, Brookline, MA (US); Robert Duris, Hubbardston, MA (US); Warren Hambly, West Bridgewater, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/811,189

(22) Filed: Mar. 26, 2004

(65) Prior Publication Data

US 2004/0239380 A1 Dec. 2, 2004

Related U.S. Application Data

(60) Provisional application No. 60/458,484, filed on Mar. 28, 2003.

(51) Int. Cl.
H03K 17/16 (2006.01)
H03B 1/00 (2006.01)
(52) U.S. Cl. ............... 326/30; 327/108; 327/321
(58) Field of Classification Search ............ 326/30, 326/83; 324/763, 73.1
See application file for complete search history.

(56) References Cited

U.S. PATENT DOCUMENTS

| | | | | |
|---|---|---|---|---|
| 5,010,297 A | * | 4/1991 | Babcock | 324/763 |
| 5,146,159 A | * | 9/1992 | Lau et al. | 324/537 |
| 5,434,446 A | | 7/1995 | Hilton et al. | |
| 5,521,493 A | * | 5/1996 | Persons | 324/158.1 |
| 6,137,329 A | * | 10/2000 | Kardash | 327/170 |
| 6,507,231 B1 | * | 1/2003 | Hecht et al. | 327/321 |
| 6,621,321 B2 | * | 9/2003 | Goldstein et al. | 327/321 |
| 6,642,707 B1 | * | 11/2003 | Iorga et al. | 324/158.1 |
| 6,759,854 B2 | * | 7/2004 | Logisch | 324/629 |
| 6,836,136 B2 | * | 12/2004 | Aghaeepour | 324/765 |

* cited by examiner

*Primary Examiner*—Vibol Tan
(74) *Attorney, Agent, or Firm*—Wolf, Greenfield & Sacks, P.C.

(57) ABSTRACT

Driver circuits and methods for operating driver circuits in automatic test equipment are provided. The driver circuit includes an output circuit operable in a dynamic mode and in a termination mode, and a mode control circuit for supplying a first current to the output circuit in the dynamic mode and for supplying a second current to the output circuit in the termination mode in response to a mode select signal. The mode control circuit may include a current multiplier and a switching circuit for switching a control current supplied to the current multiplier. In one example, the slew current supplied to the output circuit is controlled in response to the mode select signal.

17 Claims, 4 Drawing Sheets

| Driver Mode | Driver State | Slew Current | High-Side Transistors On | Low-Side Transistors On |
|---|---|---|---|---|
| Dynamic | Low (Active) | Dynamic + Standby | Q75, Q27 | Q42A, Q42B |
| Dynamic | High (Active) | Dynamic + Standby | Q85, Q41 | Q74, Q28 |
| Dynamic | Inhibit | Dynamic + Standby | Q29, Q27 | Q31, Q28 |
| Termination | Low (Active) | Standby | Q75, Q27 | Q42A, Q42B |
| Termination | High (Active) | Standby | Q85, Q41 | Q74, Q28 |
| Termination | Inhibit | Standby | Q29, Q27 | Q31, Q28 |

*FIG. 4*

DRIVER CIRCUIT WITH LOW POWER TERMINATION MODE

CROSS REFERENCE TO RELATED APPLICATION

This application claims the benefit of provisional application Ser. No. 60/458,484, filed Mar. 28, 2003, which is hereby incorporated by reference in its entirety.

FIELD OF THE INVENTION

The present invention relates to driver circuits typically utilized in automatic test equipment for driving a device under test at high speed and, more particularly, to driver circuits having a full power dynamic mode and a low power termination mode.

BACKGROUND OF THE INVENTION

Test equipment is used to evaluate the performance of integrated circuits prior to shipment to customers. Among other things, test equipment typically includes a number of "pin cards" that each have circuitry for communicating with a corresponding pin of the integrated circuit being tested (referred to in the art as "device under test", or "DUT"). Each pin card may include one or more "pin drivers" for transmitting a test signal to a corresponding pin on the DUT. The pin driver is typically connected to the corresponding pin via a relatively short transmission line.

The pin driver is commonly used in ATE (automatic test equipment) systems as both a driver and as a high quality AC termination. When the pin driver is used as a driver, the output stage has dedicated slew currents which are available for switching between vhigh and vlow levels, and in some cases to a third vterm level. When used as a termination, the pin driver provides a matched impedance to the transmission line which carries the signal from the device under to test to the pin electronics. Prior art drivers have incorporated class AB output stages with two levels (vhigh and vlow) or three levels (vhigh, vlow, and vterm). In each active level, the driver input and output stages remain fully powered up to enable high speed switching between levels. In some applications, this approach results in excessive power consumption.

SUMMARY OF THE INVENTION

According to a first aspect of the invention, a driver circuit includes mode control circuitry for selectably operating in a dynamic mode or in a termination mode. In the dynamic mode, the driver circuit operates at full power and high speed. In the termination mode, the driver circuit operates at reduced power. In either mode, the driver circuit can be operated at any of the program levels including vlow, vhigh and, if available, vterm. In addition, the driver circuit can be inhibited in either mode.

In the termination mode, power needed for high speed operation may be reduced or turned off. In particular, the slew current in the output stage may be reduced. In addition, various bias currents can be reduced or turned off as appropriate to a particular application. For example, the idle current for the output stage may be reduced, the bias current to a reverse buffer may be reduced, the bias current to a digital input circuit may be reduced, the bias current to input buffers may be reduced and/or the bias current to a cable loss compensation circuit may be reduced.

In one embodiment the current is reduced with a current multiplier. In the termination mode, a standby control current is supplied to the current multiplier. In the dynamic mode, the standby control current plus a dynamic control current is supplied to the current multiplier.

According to a second aspect of the invention, a method is provided for operating a driver circuit. The method comprises operating the driver circuit at full power in a dynamic mode, and operating the driver circuit at reduced power in a termination mode.

According to a third aspect of the invention, a driver circuit is provided for use in automatic test equipment. The driver circuit comprises an output circuit operable in a dynamic mode and in a termination mode, and a mode control circuit for supplying a first current to the output circuit in the dynamic mode and for supplying a second current to the output circuit in the termination mode in response to a mode select signal, wherein the first current is larger than the second current.

According to a fourth aspect of the invention, a method is provided for operating a driver circuit in automatic test equipment. The method comprises operating an output circuit of the driver circuit in a dynamic mode and in a termination mode in response to a mode select signal, supplying a first current to the output circuit in the dynamic mode, and supplying a second current to the output circuit in the termination mode, wherein the first current is larger than the second current.

BRIEF DESCRIPTION OF THE DRAWINGS

For a better understanding of the present invention, reference is made to the accompanying drawings, which are incorporated by reference and in which:

FIG. 4 is a table that summarizes the different operating modes and states of the output stage shown in FIGS. 2 and 3.

DETAILED DESCRIPTION

Figure 1:
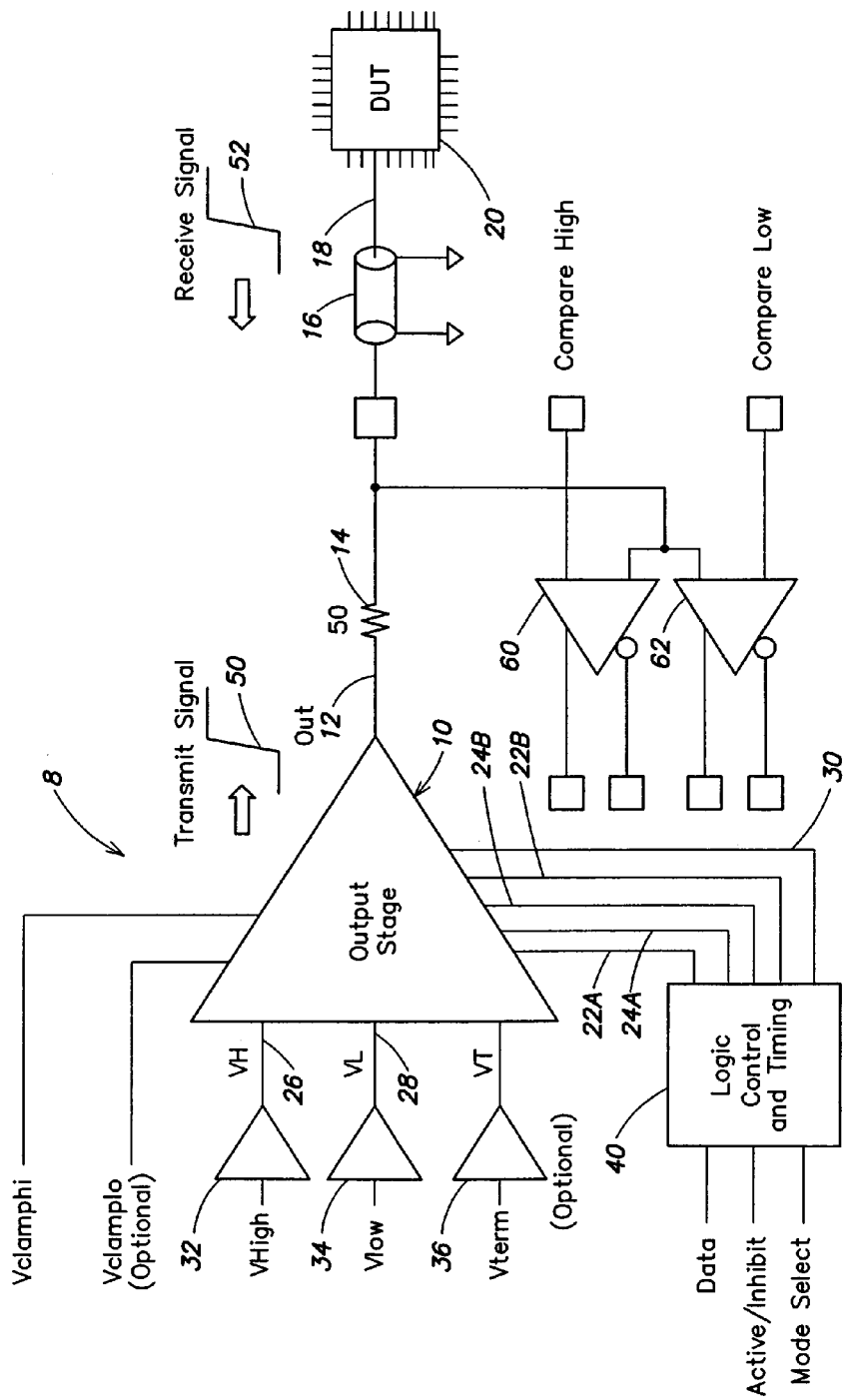
FIG. 1 is a schematic block diagram of a pin driver circuit used in an automatic test equipment pin channel.

A block diagram of a pin driver circuit 8 in accordance with an embodiment of the invention is shown in FIG. 1. An output stage 10 has an output 12 coupled through a resistor 14 and a transmission line 16 to a pin 18 of a device under test (DUT) 20. Programming voltages vhigh, vlow and vterm are supplied through input buffers 32, 34 and 36, respectively, to output stage 10. The vterm level is optional and may not be utilized in some cases. Output stage 10 preferably has an inhibit state in which output 12 has high impedance and is not switched. A logic control and timing unit 40 supplies digital control signals to output stage 10, as described below. Optional Vclamphi and Vclamplo inputs may control a clamping function as described in detail in U.S. Pat. No. 6,507,231, issued Jan. 14, 2003 to Hecht et al., which is hereby incorporated herein by reference.

The logic control and timing unit 40 receives a data input, an active/inhibit input and a mode select input from a test equipment controller. These inputs are logic level signals. The data input defines the data (high state or low state) to be supplied to pin 18 of DUT 20. The active/inhibit input establishes operation in an active state or an inhibit state. The mode select input establishes operation in a dynamic mode or in a termination mode. Signals supplied by logic control and timing unit 40 to output stage 10 include data inputs 22A and 22B, inhibit inputs 24A and 24B and mode select input 30.

In the active operating state, output stage 10 may supply a transmit signal 50 through resistor 14 and transmission line 16 to DUT 20. In the inhibit operating state, DUT 20 may supply a receive signal 52 through transmission line 16 to comparators 60 and 62. The comparators 60 and 62 may compare the receive signal 52 with high and low reference signals, respectively, as a part of a test procedure.

Driver circuit 8 transmits signal 50 to DUT 20 in the dynamic mode, which is characterized by high speed transitions between levels for testing DUT 20. Switching speeds may be on order of one nanosecond or less. The termination mode may be used when DUT 20 transmits receive signal 52 to comparators 60 and 62, and driver circuit 8 functions as part of the termination for transmission line 16. In the termination mode, driver circuit 8 is not required to perform high speed switching and, in accordance with an aspect of the invention, is at least partially powered down.

Figure 2:
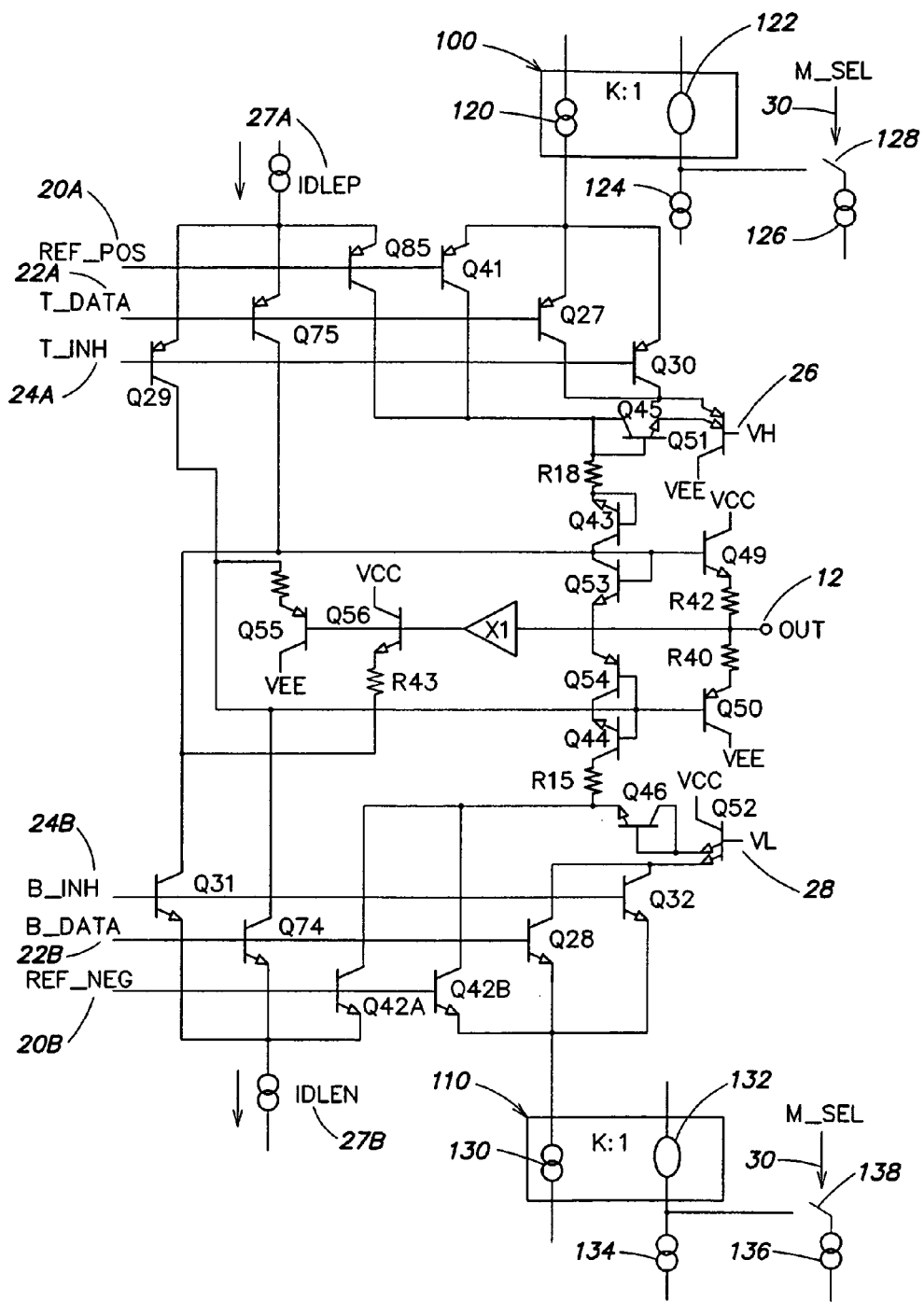
FIG. 2 is a schematic diagram of the output stage of the driver circuit in accordance with an embodiment of the invention.
Figure 3:
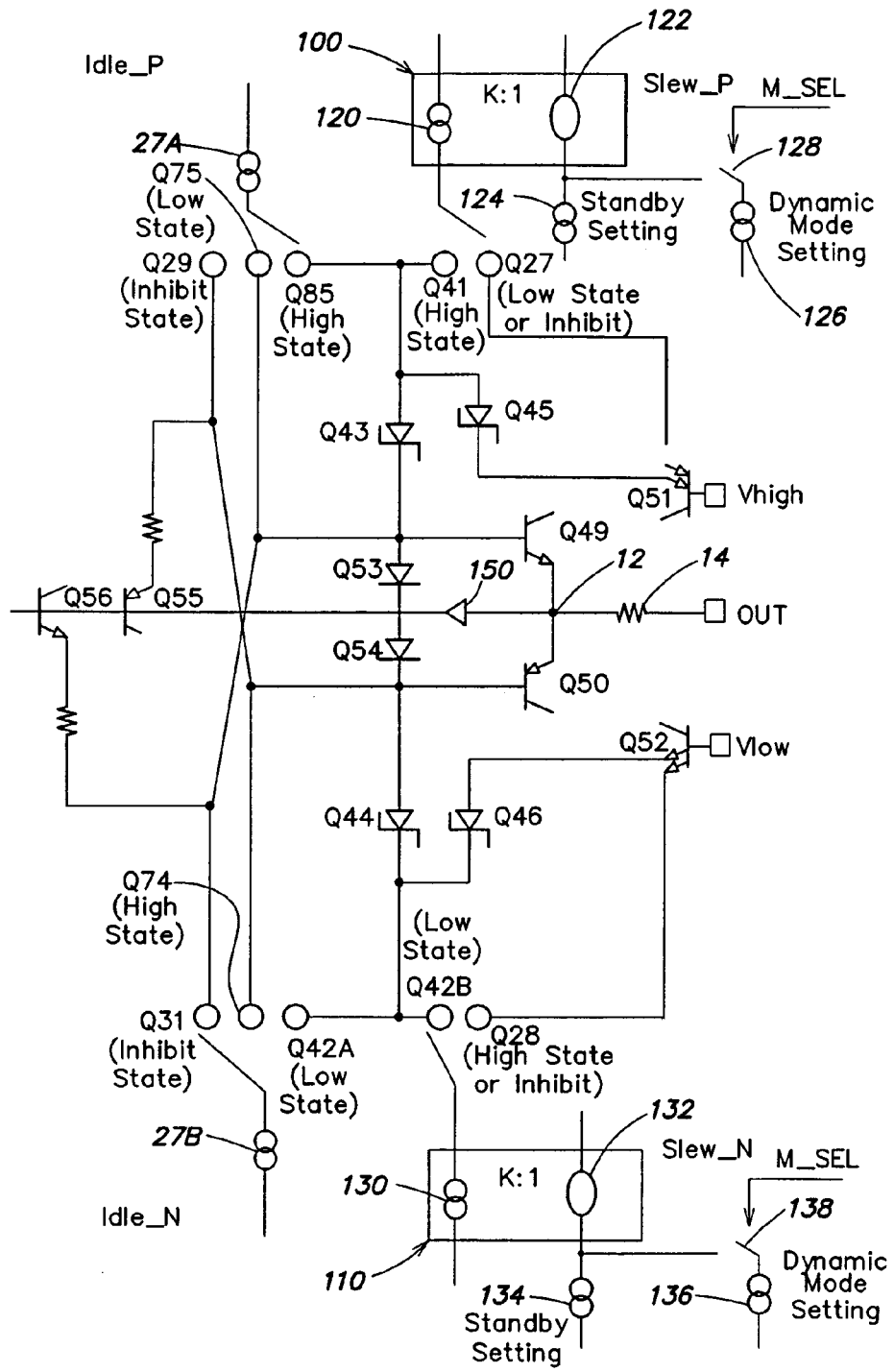
FIG. 3 is a simplified schematic diagram of the output stage of FIG. 2.

Output stage 10 is described with reference to FIGS. 2 and 3. FIG. 2 is a schematic diagram of output stage 10 in accordance with an embodiment of the invention. FIG. 3 is a schematic diagram of output stage 10, which has been simplified to facilitate an understanding of the operating states and modes. Like elements in FIGS. 2 and 3 have the same reference numerals. The embodiment of FIGS. 2 and 3 does not receive the optional Vclamphi, Vclamplo and Vterm inputs shown in FIG. 1.

Output stage 10 includes high-side transistors Q29, Q75 and Q85 for switching a positive idle current source 27A and high-side transistors Q41, Q27 and Q30 for switching a positive slew current source 120. Output stage 10 further includes low-side transistors Q31, Q74 and Q42A for switching a negative idle current source 27B and low-side transistors Q42B, Q28 and Q32 for switching a negative slew current source 130. Output stage 10 further includes bridge transistors Q45, Q43, Q44 and Q46 which function as diodes, power transistors Q49 and Q50 for delivering power to output 12, and diode-connected transistors Q53 and Q54 for maintaining power transistors Q49 and Q50 in an on state. In FIG. 2, transistors Q45, Q43, Q44 and Q46 are shown as high-breakdown diode-connected transistors, while in FIG. 3, these transistors are shown as Schottky diodes. In the embodiment of FIGS. 2 and 3, output stage 10 is a class AB driver, which requires at least one power transistor to be on at all times while the output stage 10 is operating. In addition, output stage 10 includes a vhigh transistor Q51 coupled to VH input 26 and a vlow transistor Q52 coupled to VL input 28.

Positive reference input 20A (REF_POS), positive data input 22A (T_DATA) and positive inhibit input 24A (T_INH) control high-side transistors Q29, Q75, Q85, Q41, Q27 and Q30. Negative reference input 20B (REF_NEG), negative data input 22B (B_DATA) and negative inhibit input 24B (B_INH) control low-side transistors Q31, Q74, Q42A, Q42B, Q28 and Q32. Positive reference input 20A maintains a constant positive voltage, positive data input 22A controls switching between vhigh and vlow voltages, and positive inhibit input 24A controls operation in the active or inhibit states. Similarly, negative reference input 20B maintains a constant negative voltage, negative data input 22B controls switching between vhigh and vlow voltages and negative inhibit input 24B controls operation in the active or inhibit states.

In operation, an effective capacitance at a node having transistors Q43, Q53, Q54, Q44 and the bases of transistors Q49 and Q50 is charged and discharged, thus causing the output signal to change between voltages vhigh and vlow. In particular, when the output 12 is transitioning from voltage vlow to voltage vhigh, the positive data input 22A has an applied voltage that is higher than the voltage applied to positive reference input 20A, thus turning on transistors Q85 and Q41. In a corresponding manner, the negative data input 22B has an applied voltage that is higher than the voltage applied to the negative reference input 20B, thus turning on transistors Q74 and Q28.

As a result of transistors Q85, Q41, Q74 and Q28 being on, positive idle current 27A and negative idle current 27B are connected, thus passing current through a path formed by transistors Q85, Q43, Q53, Q54 and Q74. In addition, the positive slew current 120 passes through a path formed by transistors Q41, Q43 and Q53. At the collector of Q53, which is also the base of power transistor Q49, the above-described effective capacitance charges to a maximum voltage of vhigh plus one base-emitter voltage, thus causing output 12 to rise to voltage vhigh.

Operation of output stage 10 as its output voltage transitions from voltage vhigh to voltage vlow is now discussed. In general, the output voltage is reduced by discharging the above-described effective capacitance. In particular, when the output voltage is transitioning from voltage vhigh to voltage vlow, the positive data input 22A has an applied voltage that is lower than the voltage of positive reference input 20A, thus turning on transistors Q75 and Q27. In a corresponding manner, the negative data input 22B has an applied voltage that is lower than the voltage of negative reference input 20B, thus turning on transistors Q42A and Q42B.

As a result of transistors Q75, Q27, Q42A and Q42B being on, positive idle current 27A and negative idle current 27B are connected, thus passing current through a path formed by transistors Q75, Q53, Q54, Q44 and Q42A. In addition, the positive slew current 120 passes through a path formed by transistors Q27 and Q51, and is transmitted out via VEE of Q51. At the collector of Q54, which is also the base of power transistor Q50, the above-described effective capacitance discharges, causing the base of Q50 to discharge from its maximum voltage of vhigh minus one base-emitter voltage to its minimum voltage of vlow minus one base-emitter voltage, thus causing output 12 to discharge to voltage vlow. Accordingly, the negative slew current 130, which is drawn from discharging the capacitance, passes through transistors Q54, Q44 and Q42B. Due to the discharging capacitance, the output voltage drops toward minimum voltage vlow.

In the inhibit state, output 12 appears to be an open circuit to a coupled load. The positive and negative inhibit inputs 24A and 24B are set so that transistors Q29, Q30, Q31 and Q32 are on. This directs current away from the bridge transistors Q45, Q43, Q44 and Q46 and power transistors Q49 and Q50. The positive idle current 27A passes through transistors Q29 and Q55, and the negative idle current 27B passes through transistors Q56 and Q31. In a similar manner, the positive slew current 120 passes through transistors Q30 and Q51, and the negative slew current 130 passes through transistors Q52 and Q32.

In the embodiment of FIGS. 2 and 3, the positive slew current is supplied by a current multiplier 100 and the negative slew current is supplied by a current multiplier 110. Each current multiplier sources or sinks a slew current having a ratio of K:1 with respect to a control current. Thus, current multiplier 100 supplies positive slew current 120 in response to a control current 122, and current multiplier 110 supplies negative slew current 130 in response to a control current 132. The control current includes a standby control current 124, 134, which is utilized in both the dynamic mode and the termination mode, and a dynamic control current 126, 136, which is utilized only in the dynamic mode. Thus, only the standby control current is used in the termination mode, whereas the standby control current plus the dynamic control current is used in the dynamic mode. Switches 128 and 138 are closed in the dynamic mode and are open in the termination mode. Switches 128 and 138 are controlled by the mode select input 30 (M_SEL) from logic control and timing unit 40.

Output stage 10 thus includes an output circuit and a mode control circuit. The output circuit includes the transistor circuitry shown in FIG. 2. The mode control circuit includes current multipliers 100 and 110, standby control currents 124, 134, dynamic control currents 126, 136 and switches 128, 138.

By way of example only, the ratio K:1 of the current multipliers may be in a range of about 2 to 30 and is typically about 10. The standby control current 124, 134 may be about 10% of the dynamic control current 126, 136. A typical slew current in the dynamic mode may be in a range of about 10–20 milliamps and a typical slew current in the termination mode may be in a range of about 1–2 milliamps.

It will be understood that the current multipliers 100 and 110 are only one example of techniques for reducing the current supplied to driver circuit 8 in the termination mode. For example, a programmable current source or a current switching arrangement may be utilized. However, in order to reduce power consumption, the current must in fact be reduced rather than diverted to another circuit path.

FIGS. 2 and 3 illustrate reduction of the slew current in the termination mode. Other bias currents may be reduced in the termination mode to further reduce power consumption. For example, the idle current supplied to output stage 10 may be reduced, the bias current supplied to reverse buffer 150 may be reduced, the bias current supplied to the logic control and timing unit 40 may be reduced, the bias current supplied to input buffers 32, 34 and 36 may be reduced and/or the bias current supplied to a cable loss compensation circuit may be reduced. It will be understood that some or all of the above current reductions may be utilized. In each case, the current may be controlled by a current multiplier or other current control circuit.

A simplified schematic diagram of output stage 10 is shown in FIG. 3. In FIG. 3, the transistors that control the various operating states are represented by switches. The poles of the switches have been labeled with corresponding transistor numbers from FIG. 2. As shown, transistor Q85 controls switching of positive idle current 27A in the high state, transistor Q75 controls switching of positive idle current 27A in the low state, and transistor Q29 controls switching of positive idle current 27A in the inhibit state. Only one of transistors Q85, Q75 and Q29 is on at a given time. Similarly, transistor Q74 controls switching of negative idle current 27B in the high state, transistor Q42A controls switching of negative idle current 27B in the low state, and transistor Q31 controls switching of negative idle current 27B in the inhibit state. Only one of transistors Q74, Q42A and Q31 is on at a given time.

As further shown in FIG. 3, transistor Q41 controls switching of positive slew current 120 in the high state and transistor Q27 controls switching of positive slew current 120 in the low state or the inhibit state. Only one of transistors Q41 and Q27 is on at a given time. Similarly, transistor Q42B controls switching of negative slew current 130 in the low state and transistor Q28 controls switching of negative slew current 130 in the high state or the inhibit state. Only one of transistors Q42 and Q28 is on at a given time.

A table summarizing the operating modes and states of the output stage is shown in FIG. 4. The output stage operates in the dynamic mode or in the termination mode in response to the mode select signal. Each operating mode has three states, a low state, a high state and an inhibit state. The low and high states correspond to the active state and are controlled by the positive and negative data inputs. Operation in the active state or the inhibit state is controlled by the positive and negative inhibit inputs. In the dynamic mode, the slew current is the sum of the standby current and the dynamic current. In the termination mode, the slew current is the standby current only. Operation of the switching transistors in each state is shown in FIG. 4.

In embodiments of the invention, the driver circuit may be used as an active termination when operated at one of the program levels, including vlow, vhigh or vterm (optional). In this situation, high speed switching between levels is not required. However, the high quality AC impedance of the output stage is typically required to be matched to the transmission line. The driver circuit achieves significant power savings in the termination mode.

A basic configuration of the driver circuit includes a class AB output stage and a set of switchable currents, including a standby current which is always on and a dynamic current which is on in the dynamic mode but not in the termination mode. One example of the driver circuit uses bipolar transistors for the output stage. For this implementation, the output stage may use a reverse buffer as disclosed in U.S. Pat. No. 5,434,446, issued Jul. 18, 1995 to Hilton et al., which is hereby incorporated by reference. The reverse buffer tracks the output voltage and forces the output devices into the off state when the driver is inhibited. The reverse buffer may remain on in the termination mode, or it may have a reduced bias.

In order to achieve power savings, the slew current in the output stage may be generated by a current multiplier. When the input to the multiplier is switched from standby current plus dynamic current to standby current, the multiplier output current is reduced. Therefore, the supply current is reduced and power dissipation is reduced.

In order to retain an output impedance, the idle current may remain fully on. In other embodiments, the idle current may be partially reduced if some moderate change in output impedance is acceptable. A further option is to power down the idle current. In this case, the leakage of the driver circuit in the high impedance inhibit mode may be reduced, thus achieving a low leakage mode.

The bias current to logic control and timing unit 40 may also be switched between standby current plus dynamic current to standby current to achieve additional power savings in the termination mode.

In prior art circuits, the bias current for input buffers 32, 34 and 36 was set by a bandgap circuit or other reference circuit. In order to further reduce power in the termination mode, the bias currents to input buffers 32, 34 and 36 can be reduced. This is possible because the required drive current to the driver output stage is greatly reduced when the output stage is in the termination mode.

In the case where a cable loss compensation circuit is used for the driver circuit, the cable loss compensation circuit may also be powered down. The cable loss feature does not apply to the termination mode, which has relatively slow rise and fall times. If the cable loss circuit is powered down, it should be done in a way that does not compromise the DC levels of the vlow, vhigh and vterm program voltages provided to the output stage.

A benefit of the termination mode is that the user can control slew current and optionally other bias currents. As a result, the user can control rise and fall transition times and power dissipation.

Having thus described various illustrative non-limiting embodiments, and aspects thereof, modifications and alterations will be apparent to those who have skill in the art. Such modifications and alterations are intended to be included in this disclosure, which is for the purpose of illustration and explanation, and not intended to define the limits of the invention. The scope of the invention should be determined from proper construction of the appended claims and equivalents thereof.

The invention claimed is:

1. A method for operating a driver circuit, comprising: operating the driver circuit at full power in a dynamic mode; and
operating the driver circuit at reduced power in a termination mode, wherein operating the driver circuit at reduced power comprises reducing a slew current for an output stage of the driver circuit, further comprising maintaining an idle current for the output stage at a constant level in the dynamic mode and in the termination mode, wherein reducing the slew current for the output stage includes switching a slew current source from a first slew current value to a second slew current value that is less than the first slew current value.

2. The method as defined in claim 1, wherein operating the driver circuit at reduced power comprises reducing or turning off at least one current in the driver circuit in the termination mode.

3. The method as defined in claim 1, wherein operating the driver circuit at reduced power further comprises reducing bias current to a reverse buffer of the driver circuit.

4. The method as defined in claim 1, wherein operating the driver circuit at reduced power further comprises reducing bias current to a digital input circuit of the driver circuit.

5. The method as defined in claim 1, wherein operating the driver circuit at reduced power further comprises reducing bias current to input buffers that supply programmable levels to an output stage of the driver circuit.

6. The method as defined in claim 1, wherein operating the driver circuit at reduced power comprises reducing at least one bias current to the driver circuit using a current multiplier.

7. The method as defined in claim 1, wherein operating the driver circuit at full power comprises selectably operating in a high state, a low state or an inhibit state in the dynamic mode.

8. The method as defined in claim 1, wherein operating the driver circuit at reduced power comprises selectably operating in a high state, a low state or an inhibit state in the termination mode.

9. A driver circuit for use in automatic test equipment, comprising:
an output circuit operable in a dynamic mode and in a termination mode; and
a mode control circuit for supplying a first slew current to the output circuit in the dynamic mode and for supplying a second slew current to the output circuit in the termination mode in response to a mode select signal, wherein the mode control circuit is configured to reduce the slew current for the output circuit in the termination mode and to maintain an idle current for the output circuit at a constant level in the dynamic mode and in the termination mode, wherein reducing the slew current for the output circuit includes switching a slew current source from the first slew current to the second slew current, which is less than the first slew current.

10. The driver circuit as defined in claim 9, wherein the mode control circuit comprises a current multiplier and a switching circuit for switching a control current supplied to the current multiplier in response to the mode select signal.

11. The driver circuit as defined in claim 10, wherein the first slew current includes a dynamic mode current plus a standby current and wherein the second slew current includes the standby current.

12. The driver circuit as defined in claim 10, wherein an output current of the current multiplier is about 2 to 30 times the control current.

13. The driver circuit as defined in claim 9, wherein the output circuit comprises a class AB output circuit.

14. The driver circuit as defined in claim 9, further comprising a reverse buffer coupled to the output circuit, wherein the mode control circuit is configured to control a bias current supplied to the reverse buffer in response to the mode select signal.

15. The driver circuit as defined in claim 9, further comprising a digital input circuit coupled to the output circuit, wherein the mode control circuit is configured to control a bias current supplied to the digital input circuit in response to the mode select signal.

16. The driver circuit as defined in claim 9, further comprising one or more input buffers coupled to the output circuit, wherein the mode control circuit is configured to control a bias current supplied to the one or more input buffers in response to the mode select signal.

17. A method for operating a driver circuit in automatic test equipment, comprising:
operating an output circuit of the driver circuit in a dynamic mode and in a termination mode in response to a mode select signal;
supplying a first slew current from a slew current source to the output circuit in the dynamic mode;
switching the slew current source from the first slew current to a second slew current and supplying the second slew current from the slew current source to the output circuit in the termination mode, wherein the first slew current is larger than the second slew current; and
maintaining an idle current for the output circuit at a constant level in the dynamic mode and in the termination mode.

* * * * *